April 14, 1970 J. LOOS ET AL 3,506,936

PARALLEL PLATE FEED-THROUGH CAPACITOR

Filed April 3, 1967

Inventors
JOSEPH LOOS,
MAYNARD H. McGHAY
BY
Mueller, Aichele & Rauner
ATTYS.

United States Patent Office 3,506,936
Patented Apr. 14, 1970

3,506,936

PARALLEL PLATE FEED-THROUGH CAPACITOR

Joseph Loos, Morton Grove, and Maynard H. McGhay, Schaumburg, Ill., assignors to Motorola, Inc., Franklin Park, Ill., a corporation of Illinois Filed Apr. 3, 1967, Ser. No. 628,032
Int. Cl. H01h 7/14
U.S. Cl. 333—79 6 Claims

ABSTRACT OF THE DISCLOSURE

A parallel plate feed-through capacitor includes first and second plates engaging opposite sides of a dielectric sheet. The first plate is in direct electrical connection to a chassis. A terminal lead from a circuit component is fed through the capacitor being insulated from the first plate and soldered to the second plate. This configuration minimizes lead inductance, provides shielding between adjacent circuit components, eliminates contact potential between the first plate and the chassis and improves thermal conductivity to the chassis.

BACKGROUND OF THE INVENTION

Some of the feed-through capacitors presently in use require the use of solder lugs on the capacitors for connecting the capacitor to other components. This may cause a contact potential to develop between the solder lugs and the plates. Also, the lugs produce a lead inductance which limits the effectiveness as a filter capacitor at ultra high frequencies.

Feed-through capacitors, when used in a transmitter harmonic filter application, may require an extra shielding element to be placed around the capacitor and soldered to the chassis to minimize coupling between adjacent components, since there is no shielding provision in the capacitor itself. Feed-through capacitors of this type are generally cylindrical in shape and are mounted in a circular hole in the chassis and require the use of a ring around the body that is soldered to the chassis. Other capacitors have one plate that is held to the chassis by pressure, such as by the use of a bolt. This may damage the secured plate or give rise to a contact potential between the chassis and the plate secured to the chassis caused by plate oxidization due to humidity, heat or the use of dissimilar metals. In addition, this provides relatively poor thermal conductivity between the chassis and the secured plate of the capacitor.

SUMMARY OF THE INVENTION

An object of this invention is to provide an improved parallel plate feed-through capacitor.

Another object is to provide a parallel plate feed-through capacitor for a transmitter harmonic filter in the ultra high frequency range which permits the soldering of components directly to its plates.

A further object of this invention is to provide a capacitor which forms a shield to minimize coupling between adjacent components.

A still further object is to provide a parallel plate feed-through capacitor which has a high radio frequency current carrying capability in a relatively small volume, and which can function at high ambient temperatures.

In one embodiment of this invention a parallel plate feed-through capacitor includes first and second conductive plates on opposite sides of a dielectric sheet. The capacitor can be used for a transmitter harmonic filter with the first plate soldered to the chassis and the lead of a coil inserted through a hole through the capacitor without touching the first plate and soldered to the second plate. Another coil may be soldered directly to the second plate or the lead in order to eliminate lead inductance of the capacitor. The use of this capacitor also minimizes coupling between adjacent coils by providing a grounded plane therebetween, eliminates contact potential between the first plate and the chassis, and improves thermal conductivity to the chassis.

The invention is illustrated in the drawing wherein.

DETAILED DESCRIPTION

Figure 3:
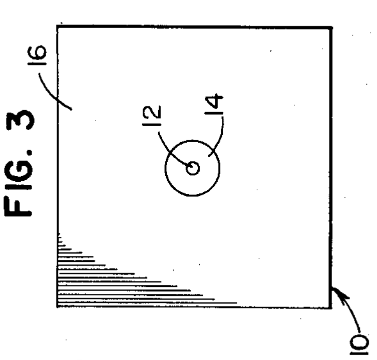
FIG. 3 is a rear view of the capacitor looking along the line 3—3 of FIG. 1.
Figure 2:
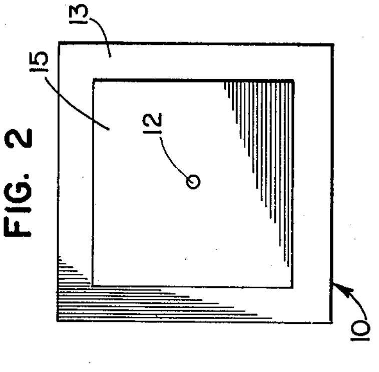
FIG. 2 is a front view of the capacitor of FIG. 1.
Figure 1:
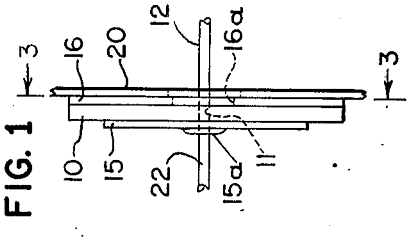
FIG. 1 is a side view of the capacitor of the invention.

Referring to FIGS. 1 to 3, the feed-through capacitor includes dielectric sheet 10 with conducting plates 15 and 16 provided on the opposite sides thereof. A hole 11 is provided in the dielectric sheet 10 through which a lead 12 extends. The lead also extends through a hole in the plate 15 and is soldered thereto as shown at **15*a*. The plate 16 has a hole 16*a* about the lead 12** of such size that the plate is insulated from the lead.

The dielectric sheet 10 may be made of alumina ($Al_2O_3$) of fixed dimensions and of a purity from 94 to 99.6 percent. The capacitor can be constructed by masking portion 13 on the front side (FIG. 2) of the dielectric sheet 10 and portion 14 on the rear side (FIG. 3) thereof. A silver paste is then brushed, painted, or sprayed on the front and rear surfaces of the dielectric sheet 10 to form plates 15 and 16. The silver paste when applied has a thickness of approximately 2 to 3 mils. The masking strips are then removed and the silver coated dielectric is subjected to a firing process, which is well known in the art. The silver plates 15 and 16 are bonded onto the dielectric by subjecting them to a gradually increasing temperature to liberate the solvents in the paste and to avoid fracturing of the body. The silver plated dielectric is then subjected to a firing temperature of from 1000° F. to 1400° F. for approximately 15 minutes. After the firing process is completed, the silver plates may have a thickness of approximately 1 mil.

Figure 4:
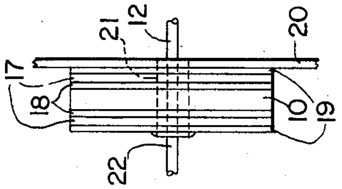
FIG. 4 illustrates a second embodiment of the invention.

As shown in FIG. 4, copper coatings 17 may be applied to the silver platings 18. These coatings can be approximately 2 mils in thickness and can be added by electroplating. If desired a further coating 19 made of a non-oxidizing material such as Alballoy can then be added by electroplating. In the structure of FIG. 4 the openings through the dielectric sheet and the electrode platings are larger than the lead 12, as shown by the dotted lines 21 to provide insulating clearance therewith.

In a practical application of the capacitor, as shown in FIG. 1, low potential plate 16 is soldered to the chassis 20. The lead wire 12 of a circuit component, such as a coil, is inserted through a hole in the chassis and through the hole in plate 16 and the smaller holes in dielectric 10 and high potential plate 15 and soldered to plate 15 at point **15*a*. The lead from another circuit component 22 may also be soldered to the high potential plate 15 at point 15*a*. The hole in plate 16 is much larger than the lead 12 in order to provide an insulating clearance for the lead 12** passing therethrough.

It should be noted that the capacitor requires no lugs for connecting it to other components, since other components can be soldered directly to the high potential plate 15. This virtually eliminates lead inductance which could otherwise cause the capacitor to have a self-resonance of from 20 megahertz to one megahertz. By effectively eliminating this lead inductance, the effectiveness of the capacitor for filtering is greatly improved in the ultra high frequency range. This, therefore, increases the frequency range over which the capacitor may operate as a filter.

In addition, since the capacitor is soldered to the chassis this allows one plate of the capacitor to function as a shielding, or a ground partition, between adjacent components, thereby minimizing coupling between components. Furthermore, since one plate is soldered to the chassis it is in direct electrical and thermal contact therewith. This improves the thermoconductivity of the capacitor by allowing heat to be dissipated into the chassis over a large area. This in turn provides a relatively high current handling ability at high ambient temperatures in relation to its size. No special tools or assembly techniques are required to mount the capacitor.

It is evident that the amount of capacitance can be varied by changing the thickness of the dielectric or the plate area. FIG. 1 shows the high potential plate 15 with a smaller area than low potential plate 16, whereas the plates of the capacitor shown in FIG. 4 are of the same size. The area of the smallest plate will, of course, control the capacitance of the device.

Figure 5:
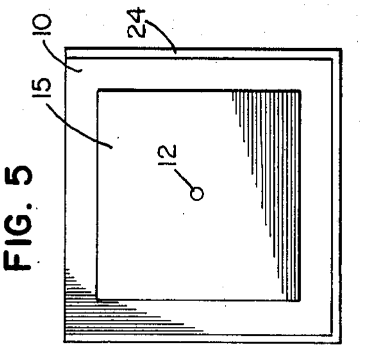
FIG. 5 illustrates a guard ring around three sides of the capacitor shown in FIG. 2.

FIG. 5 shows the capacitor of FIG. 2 with a guard ring 24 around three edges on the front side. The capacitor can be mounted to the chassis by soldering the guard ring 24 thereto. When the guard ring 24 is soldered to the chassis the capacitor can be used as either a series or shunt component. When used as a shunt component the low potential plate will be soldered to the chassis. When used as a series component the size of the plates must be decreased to prevent shorting to the chassis. The capacitor with the guard ring around it, as shown in FIG. 5, can be used in the harmonic filter network shown in FIG. 6.

Figure 6:
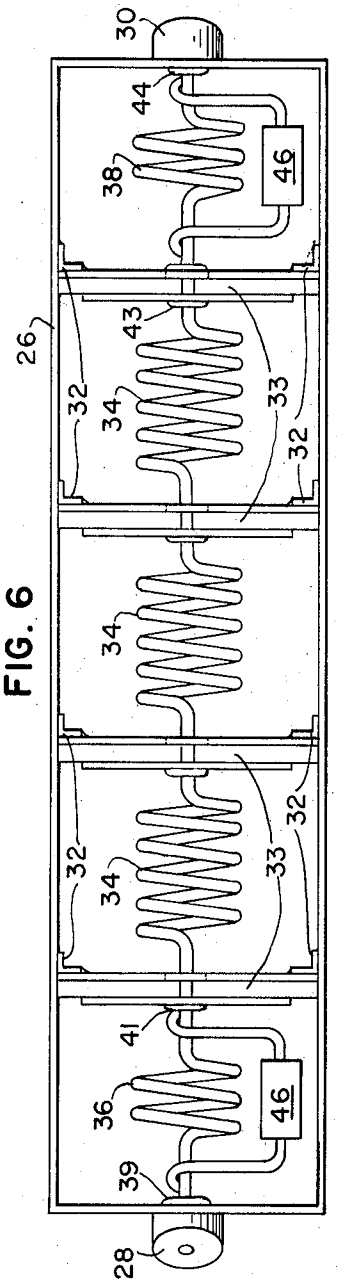
FIG. 6 illustrates a filter with the capacitor of the invention incorporated therein.

In the harmonic filter of FIG. 6, an elongated conducting housing 26 contains and shields the filter components. Input jack 28 and output jack 30 are disposed at different ends of the housing 26. Mounting brackets 32 are connected to the chassis of the housing at the desired intervals. Each of the capacitors 33, with the guard ring surrounding the outer edges of three sides, is slid down the two adjacent mounting brackets 32 and soldered to the chassis. The capacitor 33 may be soldered to the chassis on the outer edges of the low potential plate and on the bottom of the low potential plate, as well as being soldered to the mounting brackets 32. Each of the coils 34 is placed between two adjacent capacitors. One lead of the coil 34 is inserted through the hole in the capacitor 33 and is soldered to the high potential plate. The other lead of each of the coils 34 is soldered to the high potential plate of the adjacent capacitor. The end coils 36 and 38 are of a smaller inductance than the coils 34. Coil 36 is soldered between the inner terminal of connector 28 and point 41 on the high potential plate of a capacitor 33. Coil 38 is inserted through the capacitor at the extreme right hand side as shown in FIG. 6 and is soldered to point 43 on its high potential plate. The other end of coil 38 is connected to the inner terminal 45 of connector 30. A capacitor 46 is connected in parallel across each of coils 36 and 38.

Figure 7:
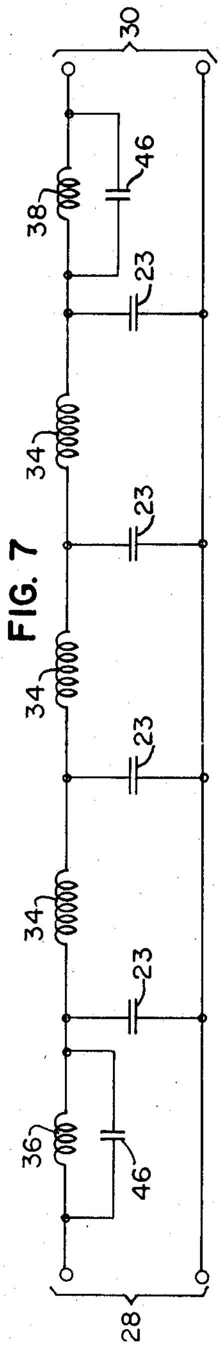
FIG. 7 is a schematic diagram of the filter of FIG. 6.

FIG. 7 is a schematic representation of the harmonic filter of FIG. 6.

Applicants have disclosed an improved parallel plate feedthrough capacitor which minimizes coupling between adjacent components, requires no lugs or connections for soldering the capacitor to other components and which provides a higher radio frequency current carrying capability in a smaller volume and a higher ambient temperature, while allowing the component to be used at higher frequencies.

We claim:

1. A filter network for use with high power signals at ultra high frequencies including in combination, elongated conducting housing means, high frequency input and output terminal fittings at the ends of said housing means, a plurality of feed through capacitors each having a sheet of dielectric material and first and second conducting plates on opposite sides thereof, said plates and said dielectric material being bonded together in parallel overlying alignment, said dielectric material providing a mechanical structure for supporting said plates, each of said capacitors having centrally located holes extending through said dielectric sheet and said first plates thereof, bracket means conductively connected to said housing means for mounting said capacitors therein for dividing said housing means into a plurality of housing sections including input, output and a plurality of intermediate sections, said first plate of each of said capacitors being conductively connected to said bracket means to connect said first plate to said housing, and a plurality of electrical components in said housing sections including one component in each section having first and second leads extending therefrom, said component in each of said intermediate filter sections being positioned between a pair of said capacitors with said first lead therefrom passing through said holes in said dielectric sheet and said first plate of one capacitor of said pair and being electrically insulated from said first plate thereof and electrically connected to said second plate thereof, and said second lead being connected to said second plate of the other capacitor of said pair, said components in said input and output housing sections being respectively connected between said high frequency input and output terminal fittings and said second plates of the adjacent feed-through capacitors, said first plates of each of said capacitors forming an electrical shield between said second plates thereof and the components in adjacent housing sections.

2. A filter network in accordance with claim 1 wherein said electrical components are coils, and said capacitors act to shield said coils.

3. The filter network of claim 1 wherein the holes through said first plate has a diameter substantially greater than the outside diameter of said lead for insulating said lead from said first plate.

4. The filter network of claim 1 wherein said first plate of said feed-through capacitor is soldered to the bracket means and said second plate is soldered to the conducting lead.

5. The filter network of claim 1 wherein said dielectric sheet of said feed-through capacitor is composed of $Al_2O_3$, and said first and second plates are formed by a silver coating bonded to said dielectric sheet.

6. The feed-through capacitor of claim 5 wherein said plates further include a second coat made of copper electroplate and a third coat made of a non-oxidizing material.

References Cited

UNITED STATES PATENTS

| | | | |
|---|---|---|---|
| 2,221,105 | 11/1940 | Otto | 317—261 X |
| 2,437,212 | 3/1948 | Schottland | 317—261 |
| 2,569,655 | 10/1951 | Cage | 317—242 |
| 2,585,752 | 2/1952 | Dorst | 317—242 X |
| 2,706,798 | 4/1955 | Kodama | 317—242 |
| 2,836,776 | 5/1958 | Ishikawa et al. | 317—242 |
| 3,025,441 | 3/1962 | West | 317—261 X |
| 3,047,780 | 7/1962 | Metz | 317—261 X |
| 3,267,396 | 8/1966 | Scott | 333—70 |
| 3,270,261 | 8/1966 | Mohler et al. | 317—261 X |
| 3,356,916 | 12/1967 | Scott | 317—242 |

HERMAN KARL SAALBACH, Primary Examiner

T. VEZEAU, Assistant Examiner

U.S. Cl. X.R.

317—261